(12) United States Patent  (10) Patent No.: US 7,629,230 B2
Sekiya et al.  (45) Date of Patent: Dec. 8, 2009

(54) WAFER PROCESSING METHOD

(75) Inventors: Kazuma Sekiya, Tokyo (JP); Keiichi Kajiyama, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/219,137

(22) Filed: Jul. 16, 2008

(65) Prior Publication Data

US 2009/0042368 A1  Feb. 12, 2009

(30) Foreign Application Priority Data

Aug. 9, 2007  (JP) .............................. 2007-208223

(51) Int. Cl.
  *H01L 21/00*  (2006.01)
(52) U.S. Cl. ................ 438/462; 438/465; 257/E21.599
(58) Field of Classification Search ................ 438/460, 438/462, 465; 257/E21.599, E21.602, E21.603
  See application file for complete search history.

(56) References Cited

U.S. PATENT DOCUMENTS

| 7,115,485 B2 * | 10/2006 | Priewasser | 438/464 |
| 7,195,988 B2 * | 3/2007 | Nemoto et al. | 438/459 |
| 7,559,826 B2 * | 7/2009 | Sekiya | 451/41 |

FOREIGN PATENT DOCUMENTS

| JP | 3537447 | 3/2004 |
| WO | 98/19337 | 5/1998 |

* cited by examiner

*Primary Examiner*—Tuan N. Quach
(74) *Attorney, Agent, or Firm*—Smith, Gambrell & Russell, LLP (57) ABSTRACT

A wafer processing method for dividing, along streets, a wafer having a device area where devices are formed in a plurality of areas sectioned by the plurality of streets arranged in a lattice pattern on the front surface of a substrate and a peripheral extra area and comprising electrodes which are embedded in the substrate of the device area, comprising a dividing groove forming step for forming dividing grooves having a depth corresponding to the final thickness of each device along the streets; an annular groove forming step for forming an annular groove having a depth corresponding to the final thickness of each device along the boundary between the device area and the peripheral extra area; a protective member affixing step for affixing a protective member to the front surface of the wafer; a rear surface grinding step for grinding a rear surface corresponding to the device area of the substrate of the wafer to expose the dividing grooves and the annular groove to the rear surface of the substrate of the wafer and form an annular reinforcing portion in an area corresponding to the peripheral extra area; and a rear surface etching step for etching the rear surface of the substrate of the wafer to project the electrodes from the rear surface of the substrate.

2 Claims, 8 Drawing Sheets

# WAFER PROCESSING METHOD

FIELD OF THE INVENTION

The present invention relates to a method for dividing, along a plurality of streets, a wafer having a device area where devices are formed in a plurality of areas sectioned by the plurality of streets formed in a lattice pattern on the front surface and a peripheral extra area surrounding the device area.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Thus formed semiconductor wafer is generally cut along the streets by using a cutting machine to be divided into individual devices which are widely used in electric equipment.

To downsize electric equipment, a multi-layered laminate type semiconductor device comprising a plurality of devices has been implemented. The method of manufacturing this type of device is disclosed by Japanese Patent Publication No. 3537447.

To form a laminate of devices, the thickness of a wafer must be reduced to 100 μm or less. However, since the stiffness of the wafer degrades when the thickness of the wafer is reduced to 100 μm or less, it is difficult to handle it in the post-process. Further, to form a laminate of devices, electrodes embedded in each device must be projected from the rear surface of the wafer. Therefore, after the rear surface of the wafer is ground to a predetermined thickness, it is etched to project the electrodes. When such thin wafer is cut along the streets by means of a cutting machine to be divided into individual devices, the periphery of each device is chipped at many positions, thereby reducing its quality.

SUMMARY OF THE INVENTION

It is an object of the present invention to provide a wafer processing method capable of securing the quality of each device even when a wafer is made thin and projecting electrodes embedded in each device from the rear surface of the wafer.

To attain the above object, according to the present invention, there is provided a wafer processing method for dividing, along a plurality of streets, a wafer having a device area where devices are formed in a plurality of areas sectioned by the plurality of streets arranged in a lattice pattern on the front surface of a substrate and a peripheral extra area surrounding the device area and comprising electrodes which are embedded in the substrate of the device area, comprising the steps of:

a dividing groove forming step for forming dividing grooves having a depth corresponding to the final thickness of each device along the streets from the front surface side of the substrate of the wafer;

an annular groove forming step for forming an annular groove having a depth corresponding to the final thickness of each device along the boundary between the device area and the peripheral extra area from the front surface side of the substrate;

a protective member affixing step for affixing a protective member to the front surface of the wafer which has undergone the dividing groove forming step and the annular groove forming step;

a rear surface grinding step for grinding a rear surface corresponding to the device area of the substrate of the wafer which has undergone the protective member affixing step to expose the dividing grooves and the annular groove to the rear surface of the substrate of the wafer and form an annular reinforcing portion in an area corresponding to the peripheral extra area; and a rear surface etching step for etching the rear surface of the substrate of the wafer which has undergone the rear surface grinding step to project the electrodes from the rear surface of the substrate.

According to the present invention, there is also provided a wafer processing method for dividing, along a plurality of streets, a wafer having a device area where devices are formed in a plurality of areas sectioned by the plurality of streets arranged in a lattice pattern on the front surface of a substrate and a peripheral extra area surrounding the device area and comprising electrodes which are embedded in the substrate of the device area, comprising the steps of:

a dividing groove forming step for forming dividing grooves having a depth corresponding to the final thickness of each device along the streets on the front surface side of the substrate of the wafer;

an annular groove forming step for forming an annular groove having a depth corresponding to the final thickness of each device along the boundary between the device area and the peripheral extra area from the front surface side of the substrate;

a protective member affixing step for affixing a protective member to the front surface of the wafer which has undergone the dividing groove forming step and the annular groove forming step;

a rear surface grinding step for grinding the rear surface corresponding to the device area of the substrate of the wafer which has undergone the protective member affixing step to form an annular reinforcing portion in an area corresponding to the peripheral extra area; and a rear surface etching step for etching the rear surface of the substrate of the wafer which has undergone the rear surface grinding step to expose the dividing grooves and the annular groove to the rear surface of the substrate and project the electrodes from the rear surface of the substrate.

In the wafer processing method of the present invention, since the wafer is divided into individual devices by carrying out the rear surface grinding step or the rear surface etching step to expose the dividing grooves and the annular groove to the rear surface of the substrate, even when the devices are made thin, the periphery of each device is not chipped unlike when the wafer is cut with a cutting machine. In the wafer processing method of the present invention, since the rear surface etching step comes after the rear surface grinding step, the electrodes can be projected from the rear surface of the substrate and grinding distortion generated on the rear surfaces of the devices by carrying out the rear surface grinding step can be removed, thereby making it possible to improve the bending strength of the devices. Further, in the wafer processing method of the present invention, though the wafer is divided into individual devices in a state where it is affixed to the protective member, the annular reinforcing portion remains and the shape of the wafer is kept, thereby making it possible to carry the wafer easily.

DETAILED DESCRIPTION OF THE PREFERRED EMBODIMENTS

Preferred embodiments of the present invention will be described in detail hereinunder with reference to the accompanying drawings.

Figure 1:
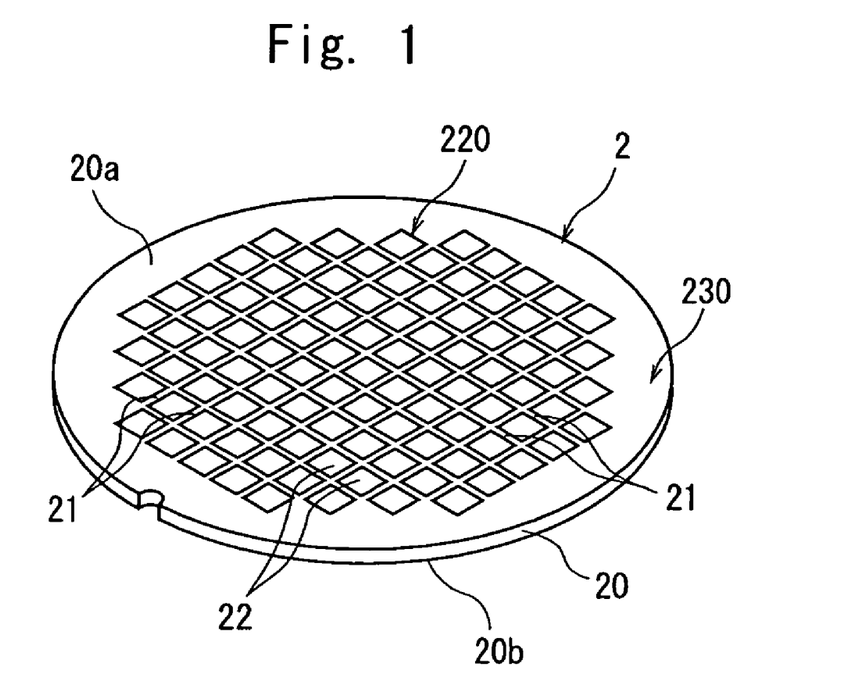
FIG. 1 is a perspective view of a semiconductor wafer as a wafer to be divided into individual devices by the wafer processing method of the present invention.
Figure 2:
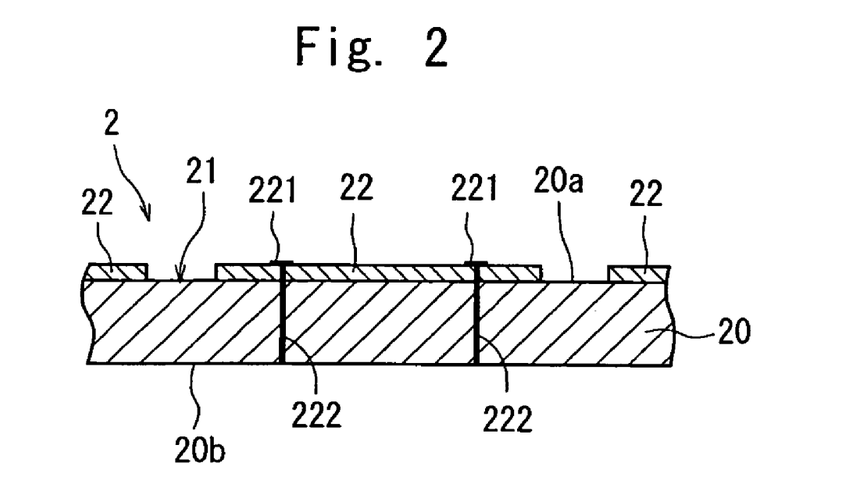
FIG. 2 is an enlarged section view of the principal section of the semiconductor wafer shown in FIG. 1.

FIG. 1 is a perspective view of a semiconductor wafer as a wafer to be processed by the wafer processing method of the present invention. The semiconductor wafer 2 shown in FIG. 1 has a plurality of streets 21 which are arranged in a lattice pattern on the front surface 20a of a silicon substrate 20 having a thickness of, for example, 700 μm and devices 22 such as IC's or LSI's which are formed in a plurality of areas sectioned by the plurality of streets 21. This semiconductor wafer 2 has a plurality of bonding pads 221 on the front surface of each device 22 and electrodes 222 which are embedded in the silicon substrate 20 and connected to the respective bonding pads 221. The semiconductor wafer 2 constituted as described above has a device area 220 where the devices 22 are formed and a peripheral extra area 230 surrounding the device area 220.

In the wafer processing method for dividing the above semiconductor wafer 2 along the streets 21 to divide it into individual devices, first comes the step of forming dividing grooves having a depth corresponding to the final thickness of each device 22 along the streets 21 from the front surface 20a side of the silicon substrate 20 of the semiconductor wafer 2. This dividing groove forming step is carried out by using a cutting machine 3 shown in FIG. 3(a). The cutting machine 3 shown in FIG. 3(a) comprises a chuck table 31 having a suction-holding means, a cutting means 32 having a cutting blade 321, and an image pick-up means 33. To carry out the dividing groove forming step by using this cutting machine 3, the front surface 20a of the silicon substrate 20 of the semiconductor wafer 2 is placed, in a state of its front surface side facing up, on the chuck table 31. Then, the semiconductor wafer 2 is held on the chuck table 31 by activating a suction means that is not shown. The chuck table 31 suction-holding the semiconductor wafer 2 is thus positioned right below the image pick-up means 33 by a cutting-feed mechanism that is not shown.

Figure 3:
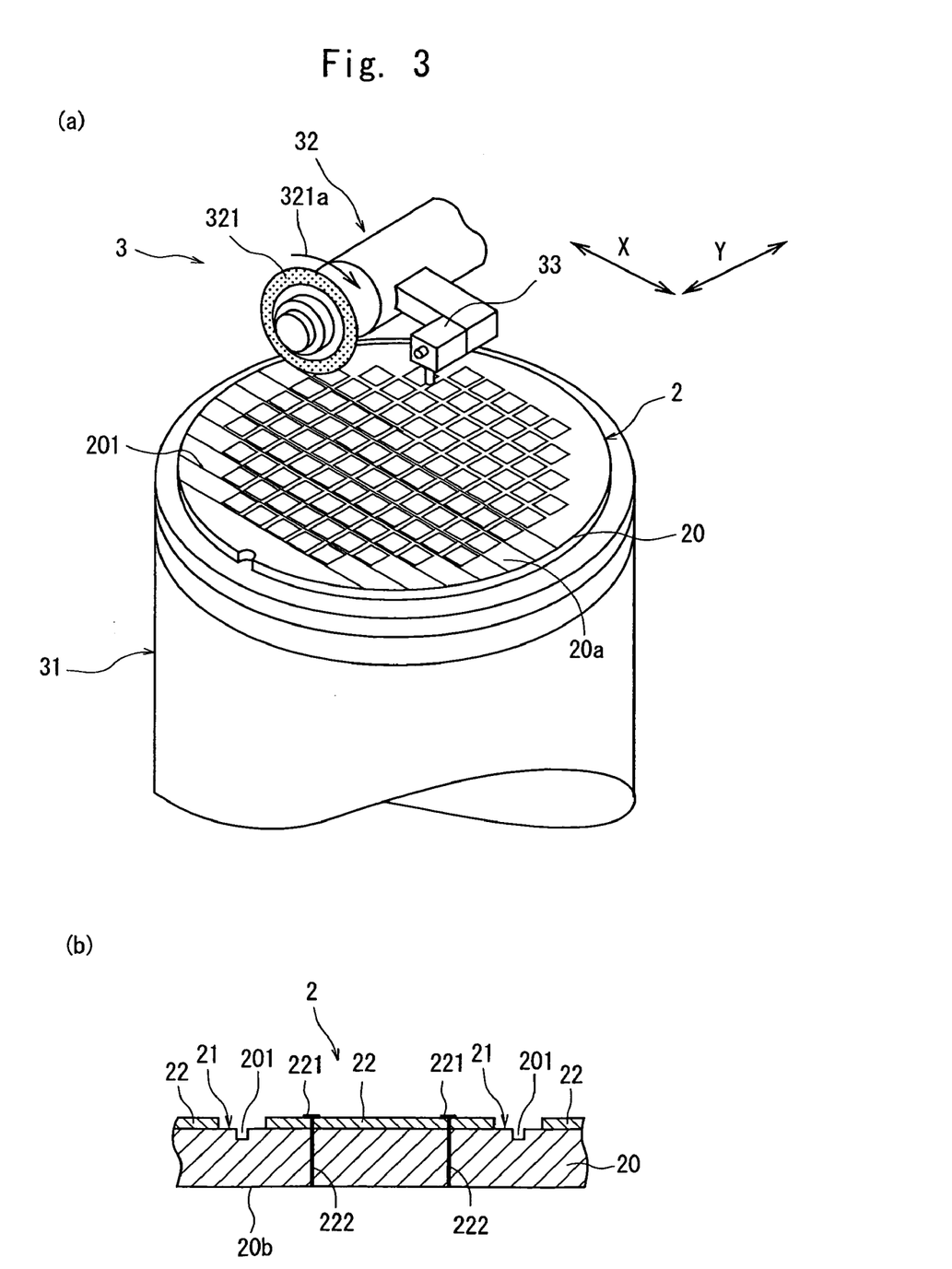
FIGS. 3(a) and 3(b) are explanatory diagrams showing a cutting machine for carrying out a dividing groove forming step in the wafer processing method of the present invention and the dividing groove forming step.

After the chuck table 31 is brought to a position right below the image pick-up means 33, alignment work for detecting the area to be cut where the dividing grooves are to be formed, of the semiconductor wafer 2 is carried out by the image pick-up means 33 and a control means that is not shown. That is, the image pick-up means 33 and the control means (not shown) carry out image processing such as pattern matching, etc. to align a street 21 formed in the predetermined direction of the semiconductor wafer 2 with the cutting blade 321, thereby performing the alignment of the area to be cut (alignment step). Further, the alignment of the area to be cut is also similarly carried out on streets 21 formed on the semiconductor wafer 2 in a direction perpendicular to the above predetermined direction.

After the alignment of the area to be cut of the semiconductor wafer 2 held on the chuck table 31 is carried out as described above, the chuck table 31 holding the semiconductor wafer 2 is moved to the cutting start position of the area to be cut. Then, the cutting blade 321 is moved down a predetermined distance (cutting-in feed) while it is rotated in a direction indicated by an arrow 321a in FIG. 3(a). This cutting-in feed position is set to the depth position (for example, 100 μm) of the peripheral edge of the cutting blade 321, which corresponds to the final thickness of each device from the front surface of the substrate 20 of the semiconductor wafer 2. After the cutting blade 321 is moved down (cutting-in fed) as described above, the subsequent cutting-in feed is performed by moving the chuck table 31 in a direction indicated by an arrow X in FIG. 3(a) while the cutting blade 321 is rotated, thereby forming a dividing groove 201 having a depth (for example, 100 μm) corresponding to the final thickness of each device from the front surface 20a along the street 21 in the silicon substrate 20 of the semiconductor wafer 2 as shown in FIG. 3(b). This dividing groove forming step is carried out on all the dividing lines 21 formed on the front surface 20a of the silicon substrate 20 of the semiconductor wafer 2.

Figure 4:
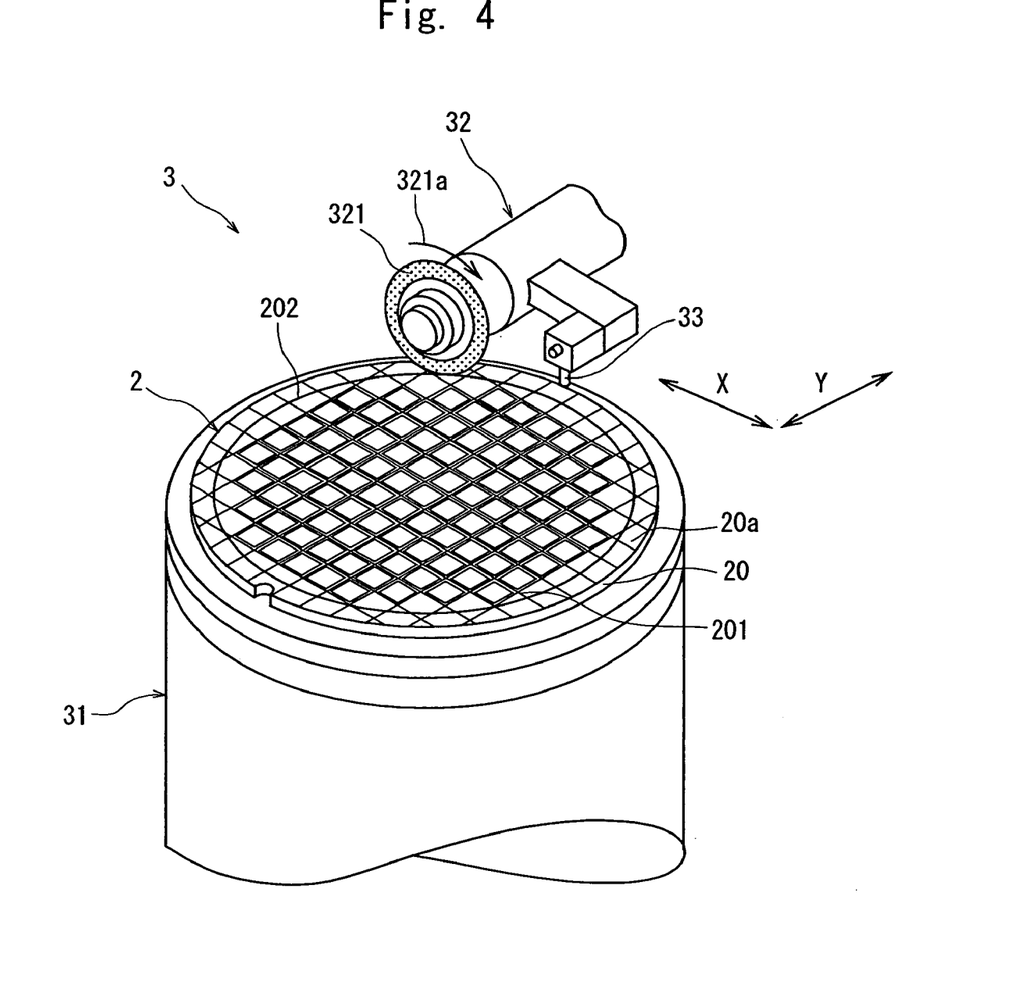
FIG. 4 is an explanatory diagram showing the cutting machine for carrying out an annular groove forming step in the wafer processing method of the present invention and the annular groove forming step.

The above dividing groove forming step is followed by the step of forming an annular groove having a depth corresponding to the final thickness of each device 22 along the boundary between the device area 220 and the peripheral extra area 230 from the front surface 2a side of the silicon substrate 20 of the semiconductor wafer 2. This annular groove forming step can be carried out by using the cutting machine 3 shown in FIG. 3(a). That is, the semiconductor wafer 2 is brought to a position right below the image pick-up means 33 as shown in FIG. 4 after the above dividing groove forming step. Then, an alignment step for detecting the area to be cut of the semiconductor wafer 2 is carried out by the image pick-up means 33 and the control means that is not shown That is, the image pick-up means 33 and the control means (not shown) carry out alignment work for aligning the boundary between the device area 220 and the peripheral extra area 230 of the semiconductor wafer 2 with the cutting blade 321.

Figure 5:
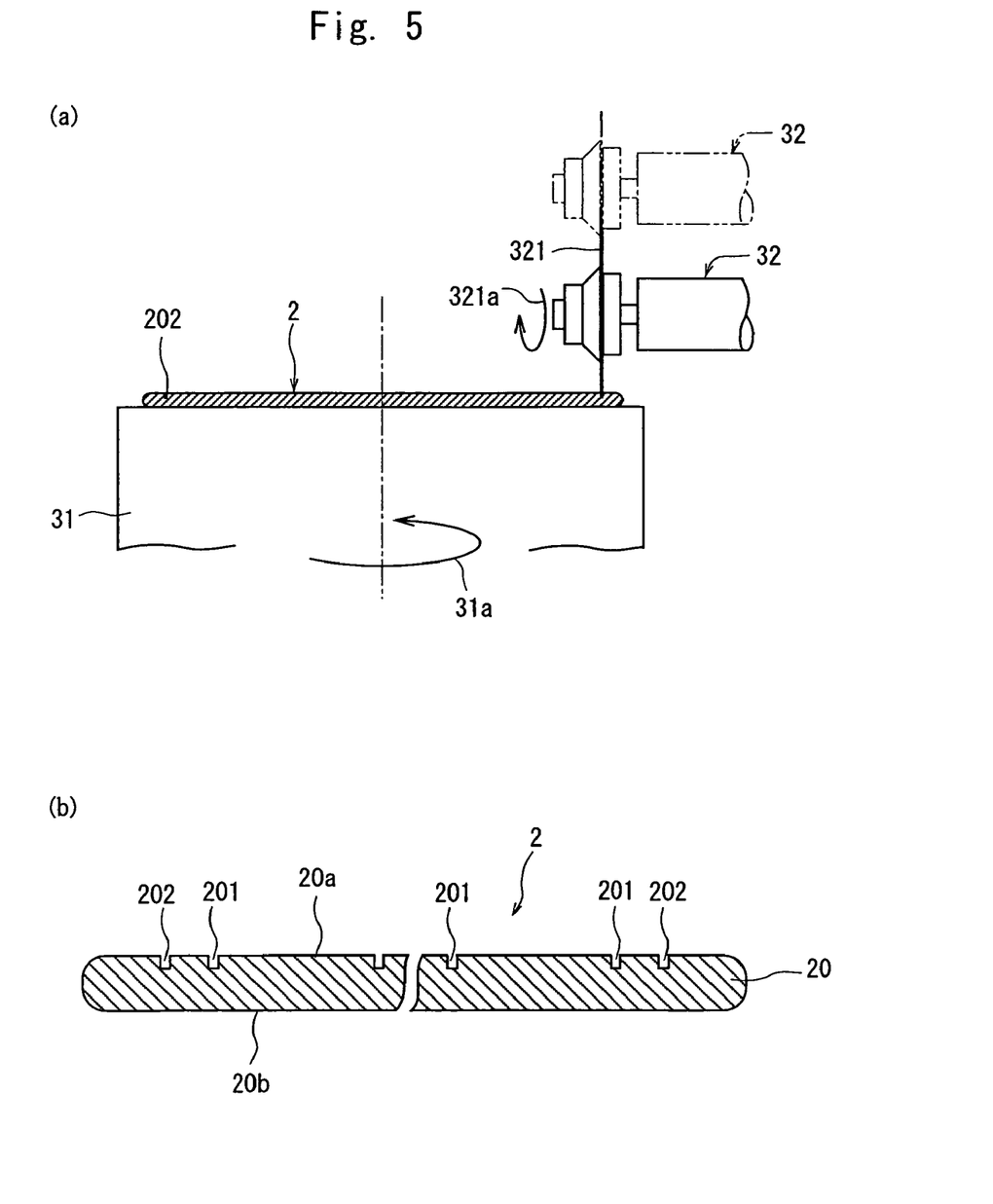
FIGS. 5(a) and 5(b) are explanatory diagrams showing the annular groove forming step in the wafer processing method of the present invention.

After alignment for detecting the area to be cut of the semiconductor wafer 2 held on the chuck table is carried out as described above, the chuck table 31 holding the semiconductor wafer 2 is moved to a cutting area. The cutting blade 321 of the cutting means 32 is brought to a position right above the boundary between the device area 220 and the peripheral extra area 230 of the semiconductor wafer 2 held on the chuck table 31. The cutting blade 321 is then moved down (cutting-in fed) from its standby position shown by a long dashed double-short dashed line to a predetermined cutting-in feed position shown by a solid line while it is rotated in a direction indicated by an arrow 321a as shown in FIG. 5(a). This cutting-in feed position is set to the depth position (for example, 100 μm) of the peripheral edge of the cutting blade 321, which corresponds to the final thickness of each device from the front surface of the silicon substrate 20 of the semiconductor wafer 2.

Thereafter, the chuck table 31 is turned in a direction indicated by an arrow 31a in FIG. 5(a) while the cutting blade 321 is rotated in the direction indicated by the arrow 321a as described above. And by one turning of the chuck table 31 as shown in FIG. 5(b), an annular groove 202 having a depth (for example, 100 μm) corresponding to the final thickness of each device is formed from the front surface 20a along the boundary between the device area 220 and the peripheral extra area 230 in the silicon substrate 20 of the semiconductor wafer 2.

Figure 6:
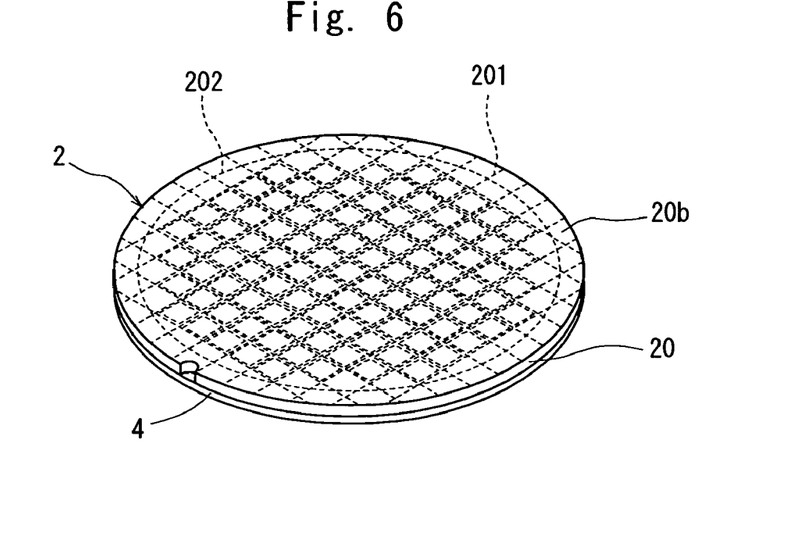
FIG. 6 is an explanatory diagram showing a protective member affixing step in the wafer processing method of the present invention.

After the above dividing groove forming step and the annular groove forming step, next comes the step of affixing a protective member to the front surface of the semiconductor wafer 2. That is, as shown in FIG. 6, a protective member 4 which is, for example, a 150 μm-thick polyolefin sheet is put on the front surface 20a (i.e., the surface on which the devices 22 are formed) of the silicon substrate 20 of the semiconductor wafer 2. Therefore, the rear surface 20b of the silicon substrate 20 of the semiconductor wafer 2 is exposed.

The above protective member affixing step is followed by the step of grinding the rear surface corresponding to the device area 220 of the silicon substrate 20 of the semiconductor wafer 2 to form an annular reinforcing portion in an area corresponding to the peripheral extra area 230. This rear surface grinding step is carried out by using a grinding machine shown in FIG. 7 in the illustrated embodiment. The grinding machine 5 shown in FIG. 7 comprises a chuck table 51 for holding a wafer as a workpiece and a grinding means 52 for grinding the processing surface of the wafer held on the chuck table 51. The chuck table 51 suction-holds the wafer on the top surface and is turned in a direction indicated by an arrow 51a in FIG. 7. The grinding means 52 comprises a spindle housing 521, a rotary spindle 522 which is rotatably supported to the spindle housing 521 and turned by a rotary-drive mechanism (not shown), a mounter 523 attached to the bottom of the rotary spindle 522 and a grinding wheel 524 mounted to the undersurface of the mounter 523. The grinding wheel 524 is composed of a disk-like base 525 and an annular grindstone 526 mounted to the undersurface of the base 525, and the base 525 is mounted to the undersurface of the mounter 523.

Figure 7:
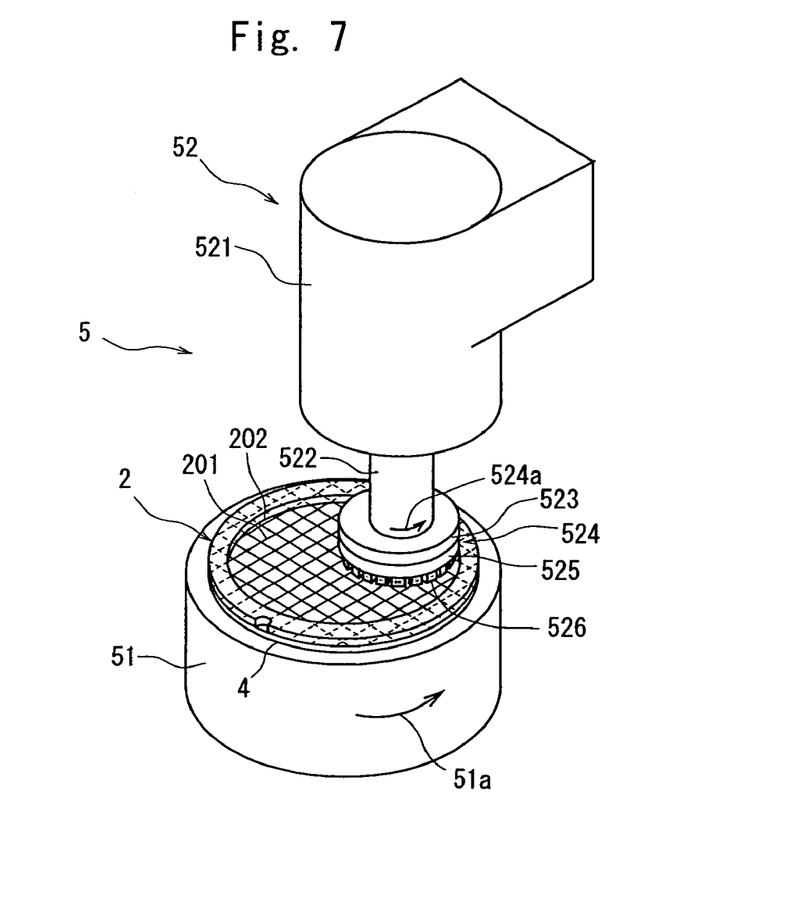
FIG. 7 is an explanatory diagram showing a grinding machine for carrying out a rear surface grinding step in the wafer processing method of the present invention and the rear surface grinding step.

To carry out the rear surface grinding step by using this grinding machine 5 shown in FIG. 7, the protective member 4 side of the above semiconductor wafer 2 which has undergone the above dividing groove forming step and the annular groove forming step and has the protective member 4 affixed to the front surface 20a of the silicon substrate 20 is first placed on the top surface (holding surface) of the chuck table 51, and then the semiconductor wafer 2 is suction-held on the chuck table 51. Therefore, the rear surface 20b of the silicon substrate 20 of the semiconductor wafer 2 held on the chuck table 51 faces up. The relationship between the semiconductor wafer 2 held on the chuck table 51 and the annular grindstone 526 constituting the grinding wheel 524 will be described with reference to FIG. 8(a). The center P1 of rotation of the chuck table 51 and the center P2 of rotation of the annular grindstone 526 are eccentric to each other, and the outer diameter of the annular grindstone 526 is set smaller than the diameter of the boundary line 240 between the device area 220 and the peripheral extra area 230 of the semiconductor wafer 2' and larger than the radius of the boundary line 240 so that the annular grindstone 526 passes over the center P1 of rotation of the chuck table 51 (the center of the semiconductor wafer 2).

Figure 8:
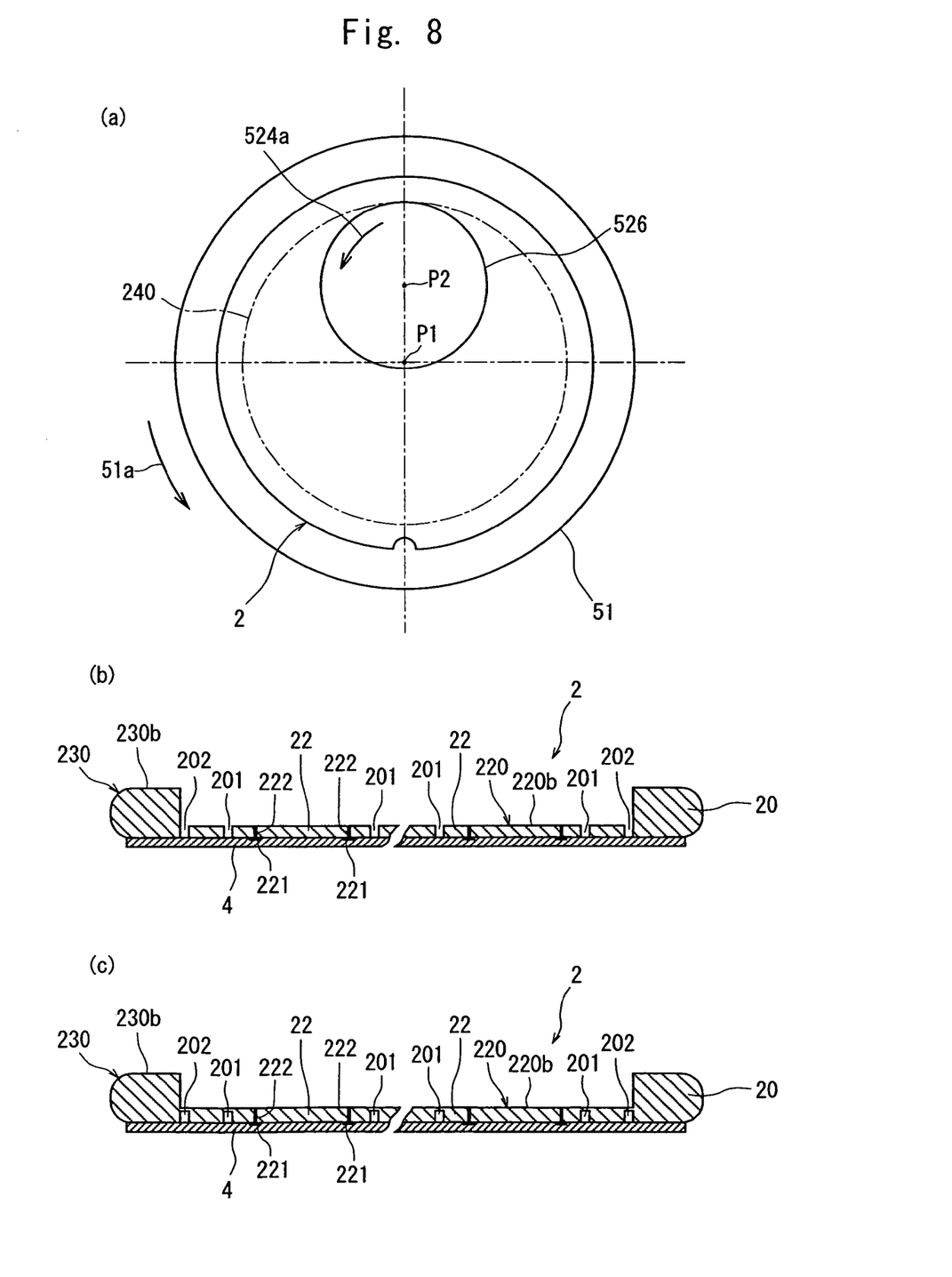
FIGS. 8(a), 8(b) and 8(c) are explanatory diagrams showing the rear surface grinding step in the wafer processing method of the present invention.

Thereafter, the grinding wheel 524 is rotated at 6,000 rpm in a direction indicated by an arrow 524a and moved down to bring the grindstone 526 into contact with the rear surface 20b of the silicon substrate 20 of the semiconductor wafer 2 while the chuck table 51 is rotated at 300 rpm in the direction indicated by the arrow 51a as shown in FIG. 7 and FIG. 8(a). The grinding wheel 524 is then moved down a predetermined distance (grinding fed) at a predetermined grinding feed rate. As a result, the area corresponding to the device area 220 of the rear surface 20b of the silicon substrate 20 of the semiconductor wafer 2 is ground and removed as shown in FIGS. 8(b) and 8(c) to form a circular depressed portion 220b, and on the other hand, the area corresponding to the peripheral extra area 230 is kept and formed as an annular reinforcing portion 230b. The practical embodiments of the rear surface grinding step will be described with reference to FIGS. 8(b) and 8(c). In the embodiment shown in FIG. 8(b), the area corresponding to the device area 220 of the rear surface 20b of the silicon substrate 20 of the semiconductor wafer 2 is ground up to the final thickness (for example, 100 μm) of each device to expose the dividing grooves 201 and the annular groove 202. As a result, the device area 220 of the semiconductor wafer 2 is divided into individual devices 22. When the semiconductor wafer 2 is ground until the dividing grooves 201 and the annular groove 202 are exposed like the embodiment shown in FIG. 8(b), the semiconductor wafer 2 is divided into individual devices 22 but the shape of the wafer is kept as the annular reinforcing portion 230b remains. On the other hand, in the embodiment shown in FIG. 8(c), grinding is stopped a few μm before the dividing grooves 201 and the annular groove 202 are exposed to the rear surface 20b of the silicon substrate 20.

The above rear surface grinding step is followed by the step of etching the rear surface of the semiconductor wafer 2 to project the electrodes from the rear surface of the semiconductor wafer 2. This rear surface etching step is carried out by using a plasma etching apparatus shown in FIG. 9 in the illustrated embodiment. The plasma etching apparatus 6 shown in FIG. 9 comprises a housing 61 which forms an etching chamber 61a. This housing 61 has a bottom wall 611, a top wall 612, right and left side walls 613 and 614, a rear side wall 615 and a front side wall (not shown), and an opening 614a for carrying in and out a workpiece is formed in the right side wall 614. A gate 62 for opening and closing the opening 614a is provided on the outer side of the opening 614a in such a manner that it can move in the vertical direction. This gate 62 is moved by a gate operating means 63. The gate operating means 63 is composed of an air cylinder 631 and a piston rod 632 connected to a piston (not shown) installed in the air cylinder 631. The air cylinder 631 is mounted to the bottom wall 611 of the above housing 61 by a bracket 633, and the end (upper end in FIG. 9) of the piston rod 632 is connected to the above gate 62. When the gate 62 is opened by this gate operating means 63, the semiconductor wafer 2 as the workpiece which has undergone the above rear surface grinding step can be carried in and out through the opening 614a.

Figure 9:
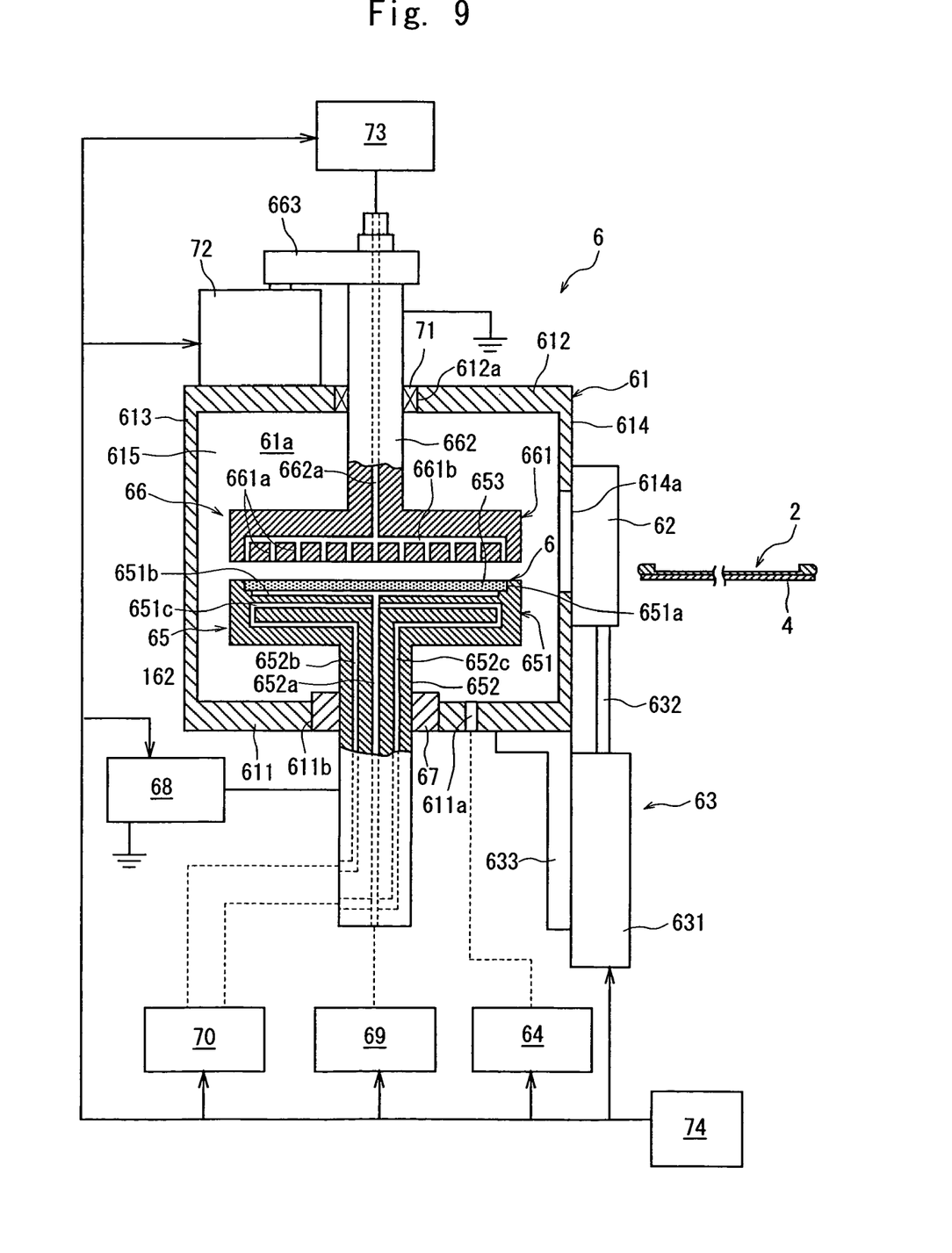
FIG. 9 is a sectional view of a plasma etching apparatus for carrying out a rear surface etching step in the wafer processing method of the present invention.

Further, a gas exhaust port 611a is formed in the bottom wall 611 constituting the housing 61 and connected to a gas exhaust means 64.

A lower electrode 65 and an upper electrode 66 are installed in the etching chamber 61a formed by the above housing 61 in such a manner that they are opposed to each other. The lower electrode 65 is made of a conductive material and is composed of a disk-like workpiece holding portion 651 and a columnar support portion 652 projecting from the center portion of the undersurface of the workpiece holding portion 651. The support portion 652 of the lower electrode 65 composed of the disk-like workpiece holding portion 651 and the columnar support portion 652 is inserted into a hole 611b formed in the bottom wall 611 of the housing 61 and supported in a sealed state by an insulator 67 in the bottom wall 611. The lower electrode 65 thus supported in the bottom wall 611 of the housing 61 is electrically connected to a high-frequency power source 68 through the support portion 652.

A circular depressed portion to be fitted 651a which is open at the top is formed in the top portion of the workpiece holding portion 651 constituting the lower electrode 65, and a disk-like adsorption holding member 653 made of a porous ceramic material is fitted in the depressed portion to be fitted 651a. A chamber 651b formed below the adsorption holding member 653 in the depressed portion to be fitted 651a is communicated to a suction means 69 through a communication path 652a formed in the workpiece holding portion 651 and the support portion 652. Therefore, when the workpiece is placed on the adsorption holding member 653 and the suction means 69 is activated to communicate the communication path 652a to a negative pressure source, whereby negative pressure acts on the chamber 651b to suction-hold the workpiece placed on the adsorption holding member 653. When the suction means 69 is activated to make the communication path 652a open to the air, the suction-holding of the workpiece suction-held on the adsorption holding member 653 is canceled.

A cooling path 651c is formed in the lower portion of the workpiece holding portion 651 constituting the lower electrode 65. One end of the cooling path 651c is communicated to a refrigerant introduction path 652b formed in the support portion 652 and the other end of the cooling path 651c is communicated to a refrigerant exhaust path 652c formed in the support portion 652. The refrigerant introduction path 652b and the refrigerant exhaust path 652c are communicated to a refrigerant supply means 70. Therefore, when the refrigerant supply means 70 is activated, a refrigerant is circulated through the refrigerant introduction path 652b, the cooling path 651c and the refrigerant exhaust path 652c. As a result, heat generated at the time of plasma etching treatment which will be described later is transmitted from the lower electrode 65 to the refrigerant, thereby preventing an abnormal rise in the temperature of the lower electrode 65.

The above upper electrode 66 is made of a conductive material and composed of a disk-like gas ejection portion 661 and a columnar support portion 662 projecting from the center portion of the top surface of the gas ejection portion 661. The upper electrode 66 composed of the gas ejection portion 661 and the columnar support portion 662 is arranged such that the gas ejection portion 661 is opposed to the workpiece holding portion 651 constituting the lower electrode 65, and the support portion 662 is inserted into a hole 612a formed in the top wall 612 of the housing 61 and supported in such a manner that it can move in the vertical direction, by a sealing member 71 fitted in the hole 612a. A working member 663 is mounted on the top end of the support portion 662 and connected to a lifting drive means 72. The upper electrode 66 is grounded through the support portion 662.

A plurality of ejection holes 661a which are open to the undersurface are formed in the disk-like gas ejection portion 661 constituting the upper electrode 66. The plurality of ejection holes 661a are communicated to a gas supply means 73 through a communication path 661b formed in the gas ejection portion 661 and a communication path 662a formed in the support portion 662. The gas supply means 73 supplies plasma generating a mixed gas essentially composed of a fluorine-based gas such as $SF_6$ and oxygen.

The plasma etching apparatus 6 in the illustrated embodiment has a control means 74 for controlling the gate operating means 63, the gas exhaust means 64, the high-frequency power source 68, the suction means 69, the refrigerant supply means 70, the lifting drive means 72 and the gas supply means 73. Data on the inside pressure of the etching chamber 61a formed by the housing 61, data on the temperature of the refrigerant (that is, the temperature of the electrode) and data on the flow rate of the gas are supplied to the control means 74 from the gas exhaust means 64, the refrigerant supply means 70 and the gas supply means 73, respectively. The control means 74 outputs control signals based on the above data to the above respective means.

The plasma etching apparatus 6 in the illustrated embodiment is constituted as described above, and a description will be subsequently given of the rear surface etching step for plasma etching the rear surface 20b side of the silicon substrate 20 of the semiconductor wafer 2 which has undergone the rear surface grinding step as described above, to project the electrodes from the rear surface 20b of the silicon substrate 20 of the semiconductor wafer 2.

The gate operating means 63 is first activated to move down the gate 62 in FIG. 9 so as to open the opening 614a formed in the right side wall 614 of the housing 61. The semiconductor wafer 2 which has undergone the rear surface grinding step (the front surface 20a of the silicon substrate 20 is affixed to the protective member) is carried in the etching chamber 61a formed by the housing 61 from the opening 614a by a means for carrying in and out (not shown), and the protective member 4 side of the semiconductor wafer 2 is placed on the adsorption holding member 653 of the workpiece holding portion 651 constituting the lower electrode 65. At this point, the upper electrode 66 has been moved up by activating the lifting drive means 72. The suction means 69 is then activated to let act negative pressure on the chamber 651b of the lower electrode 65, whereby the semiconductor wafer 2 is suction-held on the adsorption holding member 653 through the protective member 4 (see FIG. 10).

Figure 10:
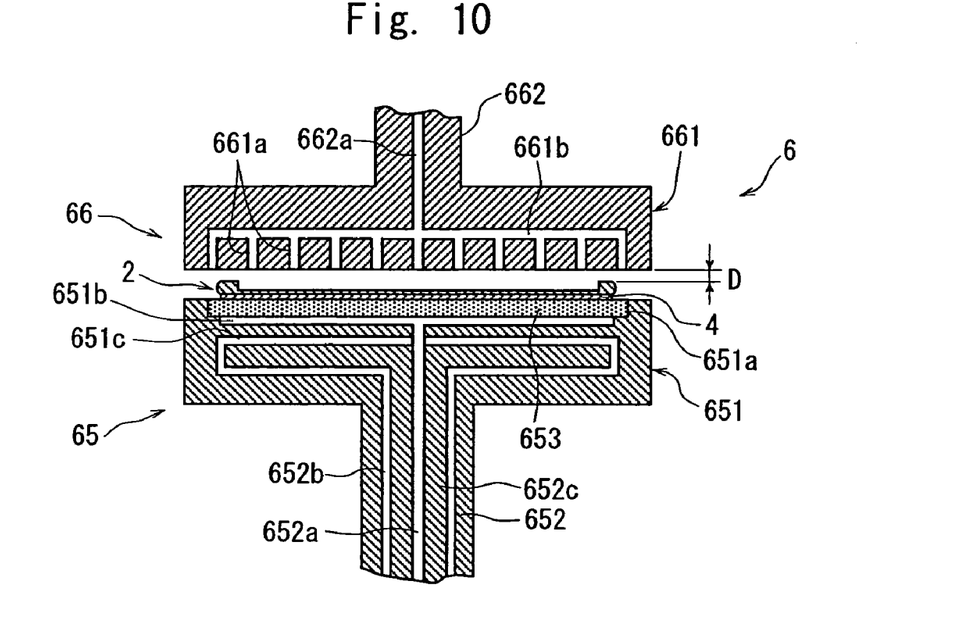
FIG. 10 is a sectional view of the plasma etching apparatus shown in FIG. 9 in a state that a protective member affixed to the semiconductor wafer is placed on a workpiece holding portion constituting the lower electrode of the plasma etching apparatus.

After the semiconductor wafer 2 is suction-held on the adsorption holding member 653 through the protective member. 4, the gate operating means 63 is activated to move up the gate 62 in FIG. 9 so as to close the opening 614a formed in the right side wall 614 of the housing 61. The lifting drive means 72 is then activated to move down the upper electrode 66 such that the distance(D) between the undersurface of the gas ejection portion 661 constituting the upper electrode 66 and the top surface (rear surface 20b of the silicon substrate 20) of the semiconductor wafer 2 having the protective member 4 affixed thereon, which has been held on the workpiece holding portion 651 constituting the lower electrode 65, is positioned to be a predetermined value suitable for plasma etching treatment, as shown in FIG. 10. In this case, the distance (D) between the electrodes is set to 10 mm in the illustrated embodiment.

Thereafter, an electrostatic-force generating means arranged to the workpiece holding portion 651 is activated to hold the semiconductor wafer 2 electrostatically and the gas exhaust means 64 is activated to evacuate the inside of the etching chamber 61a formed by the housing 61. After the inside of the etching chamber 61a is evacuated to reduce the inside pressure, the gas supply means 73 is activated to supply a plasma generating gas to the upper electrode 66. The plasma generating gas supplied from the gas supply means 73 is ejected from the plurality of ejection holes 661a toward the rear surface 2b (top surface) of the semiconductor wafer 2 held on the adsorption holding member 653 of the lower electrode 65 through the communication path 662a formed in the support portion 662 and the communication path 661b formed in the gas ejection portion 661. And, the inside of the etching chamber 61a is maintained at a predetermined gas pressure. A high-frequency voltage is applied between the lower electrode 65 and the upper electrode 66 from the high-frequency power source 68 in a state where the plasma generating gas has been thus supplied. Thereby, $SF_6$ plasma is generated in the space between the lower electrode 65 and the upper electrode 66, and an active substance produced by this plasma acts on the rear surface 2b of the semiconductor wafer 2 to etch the rear surface 20b of the silicon substrate 20 of the semiconductor wafer 2.

The above rear surface etching step is carried out under the following conditions, for example.

Figure 11:
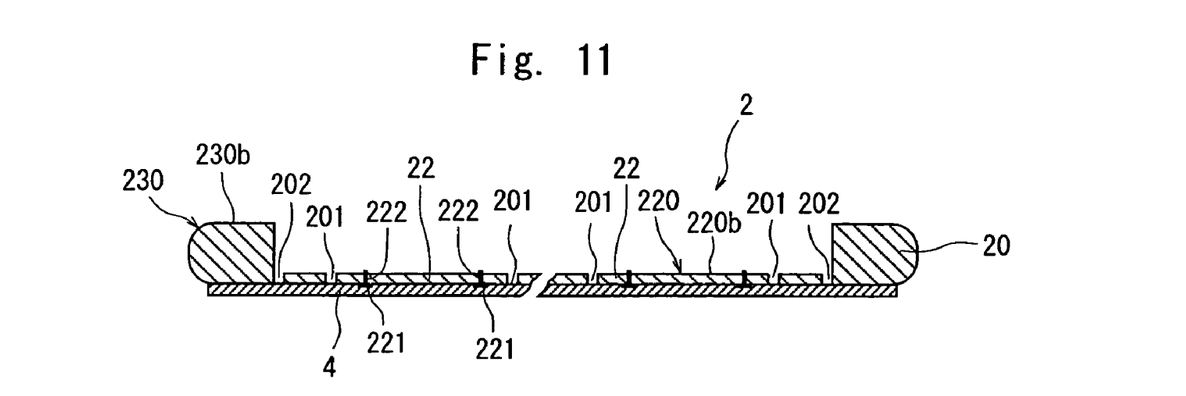
FIG. 11 is an enlarged sectional view of the principal section of the semiconductor wafer which has undergone the rear surface etching step in the wafer processing method of the present invention.

Output of power source 68: 2,000 W
Inside pressure of etching chamber 61a: 80 Pa
Plasma generating gas:
  76 ml/min of $SF_6$, 15 ml/min of He and 27 ml/min of $O_2$,
  76 ml/min of $SF_6$, 15 ml/min of $CHF_3$, and 27 ml/min of $O_2$, or
  76 ml/min of $SF_6$, 15 ml/min of $N_2$ and 27 ml/min of $O_2$
Etching time: 3 minutes When the rear surface etching step is carried out under the above processing conditions, the rear surface 20b of the silicon substrate 20 constituting the semiconductor wafer 2 is etched a few μm. As a result, the electrodes 222 are projected a few μm from the rear surface 20b of the silicon substrate 20 of the semiconductor wafer 2 as shown in FIG. 11. When the grinding of the semiconductor wafer 2 is stopped a few μm before the dividing grooves 201 and the annular groove 202 are exposed to the rear surface 20b of the silicon substrate 20 like the embodiment shown in FIG. 8(c) in the above rear surface grinding step, the electrodes 222 are projected a few μm from the rear surface 20b of the silicon substrate 20 and the dividing grooves 201 and the annular groove 202 are exposed to the rear surface 20b of the silicon substrate 20 by carrying out the above etching step. As a result, the device area 220 of the semiconductor wafer 2 is divided into individual devices 22.

After the electrodes 222 are projected from the rear surface 20b of the silicon substrate 20 of the semiconductor wafer 2 and the device area 220 is divided into individual devices 22 by carrying out the rear surface etching step as described above, the semiconductor wafer 2 is carried to the subsequent pick-up step for picking up the individual devices 22. At this point, although the semiconductor wafer 2 is divided into individual devices 22 in a state where it is affixed to the protective member 4, the annular reinforcing portion 230b remains and the shape of the wafer is kept, thereby making it possible to carry the semiconductor wafer 2 easily.

In the wafer processing method in the illustrated embodiment, since the rear surface grinding step or the rear surface etching step is carried out to expose the dividing grooves 201 and the annular groove 202 to the rear surface 20b of the silicon substrate 20 so as to divide the semiconductor wafer 2 into individual devices 22, even when the devices are made thin, the periphery of each device is not chipped unlike when the semiconductor wafer 2 is cut with a cutting machine. In the wafer processing method in the illustrated embodiment, since the rear surface etching step is carried out after the above rear surface grinding step, the electrodes 222 can be projected from the rear surface 20b of the silicon substrate 20 and grinding distortion generated on the rear surface of each device by carrying out the rear surface grinding step can be removed, thereby making it possible to improve the bending strength of the device.

What is claimed is:

1. A wafer processing method for dividing, along a plurality of streets, a wafer having a device area where devices are formed in a plurality of areas sectioned by the plurality of streets arranged in a lattice pattern on the front surface of a substrate and a peripheral extra area surrounding the device area and comprising electrodes which are embedded in the substrate of the device area, comprising:

a dividing groove forming step for forming dividing grooves having a depth corresponding to the final thickness of each device along the streets from the front surface side of the substrate of the wafer;

an annular groove forming step for forming an annular groove having a depth corresponding to the final thickness of each device along the boundary between the device area and the peripheral extra area from the front surface side of the substrate;

a protective member affixing step for affixing a protective member to the front surface of the wafer which has undergone the dividing groove forming step and the annular groove forming step;

a rear surface grinding step for grinding the rear surface corresponding to the device area of the substrate of the wafer which has undergone the protective member affixing step to expose the dividing grooves and the annular groove to the rear surface of the substrate of the wafer and form an annular reinforcing portion in an area corresponding to the peripheral extra area; and a rear surface etching step for etching the rear surface of the substrate of the wafer which has undergone the rear surface grinding step to project the electrodes from the rear surface of the substrate.

2. A wafer processing method for dividing, along a plurality of streets, a wafer having a device area where devices are formed in a plurality of areas sectioned by the plurality of streets arranged in a lattice pattern on the front surface of a substrate and a peripheral extra area surrounding the device area and comprising electrodes which are embedded in the substrate of the device area, comprising:

a dividing groove forming step for forming dividing grooves having a depth corresponding to the final thickness of each device along the streets on the front surface side of the substrate of the wafer;

an annular groove forming step for forming an annular groove having a depth corresponding to the final thickness of each device along the boundary between the device area and the peripheral extra area from the front surface side of the substrate;

a protective member affixing step for affixing a protective member to the front surface of the wafer which has undergone the dividing groove forming step and the annular groove forming step;

a rear surface grinding step for grinding the rear surface corresponding to the device area of the substrate of the wafer which has undergone the protective member affixing step to form an annular reinforcing portion in an area corresponding to the peripheral extra area; and a rear surface etching step for etching the rear surface of the substrate of the wafer which has undergone the rear surface grinding step to expose the dividing grooves and the annular groove to the rear surface of the substrate and project the electrodes from the rear surface of the substrate.

* * * * *